US012720791B2

(12) United States Patent
Teo et al.

(10) Patent No.: US 12,720,791 B2
(45) Date of Patent: Aug. 25, 2026

(54) HIGH ELECTRON MOBILITY TRANSISTORS WITH LOW SPECIFIC ON-RESISTANCE

(71) Applicant: Mitsubishi Electric Research Laboratories, Inc., Cambridge, MA (US)

(72) Inventors: Koon Hoo Teo, Lexington, MA (US); Nadim Chowdhury, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 419 days.

(21) Appl. No.: 18/537,865

(22) Filed: Dec. 13, 2023

(65) Prior Publication Data

US 2025/0203907 A1 Jun. 19, 2025

(51) Int. Cl.

*H10D 30/47* (2025.01)
*H10D 30/01* (2025.01)
*H10D 62/17* (2025.01)
*H10D 62/85* (2025.01)
*H10D 64/23* (2025.01)

(52) U.S. Cl.

CPC ......... *H10D 30/475* (2025.01); *H10D 30/015* (2025.01); *H10D 30/478* (2025.01); *H10D 62/221* (2025.01); *H10D 62/8503* (2025.01); *H10D 64/256* (2025.01)

(58) Field of Classification Search

CPC .. H10D 30/478; H10D 30/015; H10D 30/475; H10D 62/124; H10D 62/221; H10D 64/256; H10D 64/411

See application file for complete search history.

(56) References Cited

U.S. PATENT DOCUMENTS 5,530,272 A * 6/1996 Kudo .................... B82Y 10/00 257/192
2017/0373200 A1* 12/2017 Shibata .................... H10D 8/60
2019/0207020 A1* 7/2019 Lin .................... H10D 30/4755
2019/0288101 A1* 9/2019 Longobardi ......... H10D 62/106
2020/0044066 A1* 2/2020 Suzuki .............. H10D 62/8503

* cited by examiner

*Primary Examiner* — Yu Chen
(74) *Attorney, Agent, or Firm* — Gene Vinokur

(57) ABSTRACT

A transistor comprises a layered semiconductor structure electrically connected to a plurality of electrodes forming a source, a gate, and a drain of the transistor. The layered semiconductor structure includes a channel layer having a shape formed by a set of fins, and a barrier layer on the channel layer such that the barrier layer coats the fins of the channel layer to define a shape formed by a series of wells. The series of wells of the barrier layer are interdigitated with the series of fins of the channel layer. The barrier layer is formed with polar piezoelectric material having a first lattice constant and the channel layer is formed with polar material having a second lattice constant, where the second lattice constant is greater than the first lattice constant.

17 Claims, 7 Drawing Sheets

Antenna
410
O/p matching network
408
406
$V_{DD}$
400
I/p matching network
404
Input
402

HIGH ELECTRON MOBILITY TRANSISTORS WITH LOW SPECIFIC ON-RESISTANCE

TECHNICAL FIELD

The present disclosure relates generally to semiconductor devices, and more particularly to a high electron mobility semiconductor device with low sheet resistance for high current, high input impedance and higher switching speed operations.

BACKGROUND

High Electron Mobility Transistors (HEMT) are capable of providing efficient current flows at high voltages. HEMT devices can operate at higher temperatures due to the wide bandgap of III-N materials used in HEMTs. Furthermore, HEMTs are highly suitable for high frequency operations. As such, High Electron Mobility Transistors are a promising class of semiconductor devices that offer high power and high-frequency performance. Their wide bandgap, high electron mobility, and low capacitance make them well-suited for a wide range of applications, including wireless communication systems and power electronics.

A HEMT has a high-power density due to high electron mobility provided by an underlying two-dimensional electron gas (2DEG) channel. The 2DEG channel has a high electron mobility, which allows for efficient current flow at high voltages. This enables a HEMT device to handle high power levels while maintaining a low on-resistance. Additionally, the wide bandgap of the GaN material allows for high-temperature operation, which is important for many applications, including wireless communication systems and power electronics.

However, certain applications require the HEMT to have a very low on resistance that results in a higher current density for the HEMT without requiring any significant change in the chip area of the semiconductor device. Conventional approaches in this regard have required the use of different materials for the channel and/or barrier layers which often leads to a completely different structure having an increased dimensions of the HEMT device, thereby limiting the applicability and usage of the HEMT device.

Accordingly, improved device structures and methods of manufacturing them are desired to provide a HEMT device with low sheet resistance.

SUMMARY

Example embodiments described herein are directed towards an improved HEMT structure, devices based on the improved HEMT structure, and methods of manufacturing thereof. Some example embodiments provide a HEMT device configuration with an increased current density for a given chip area as compared to a planar HEMT configuration. The increased current density results from a low sheet resistance of the HEMT and thus for a given chip area, the proposed HEMT device architecture yields an on-resistance lower than that of conventional HEMTs. Such an architecture of the transistor allows for an increment in the heterojunction area leading to much higher carrier density in the device compared to a planar HEMT configuration. The proposed semiconductor device finds application in a wide array of use cases, some non-limiting examples of which include amplifiers, power supplies, and other applications where high current and high input impedance and higher switching speed are desirable.

It is an object of some embodiments to provide a HEMT configuration with an increased sheet resistance without significantly increasing the chip area. Some embodiments are based on the realization that growth of wide bandgap material over narrow bandgap material, results in a two-dimensional electron gas (2-DEG) at the heterointerface due to the conduction band discontinuity. Accumulation of the high density 2-DEG is due to the formation of a deep spike-shaped quantum well at the heterojunction, where there is a large conduction-band offset as well as a large discontinuity in the piezoelectric and spontaneous polarization. For example, AlGaN is a wide bandgap semiconductor of energy gap, $E_g$=4.24 eV and GaN is a comparatively less bandgap than AlGaN having energy gap, $E_g$=3.4 eV. The growth of wide bandgap material over narrow band gap material creates a 2-DEG in the heterointerface, so that confinement of electrons in the quantum well is possible, which leads to higher mobility, resulting in a high-speed device.

One way to increase the carrier density is to increase the concentration of aluminum (Al) in the wide bandgap material. However, some embodiments realize that increasing the concentration of Al beyond a threshold creates strain-related issues caused by large lattice mismatch. The strain-related issues of high-Al-composition AlGaN barriers may be roughly divided into two types: crack formation and 2-dimensional electron gas (2-DEG) mobility degradation. The different lattice constants between AlGaN and GaN cause tensile strain in AlGaN barriers. For the high Al composition of AlGaN barrier, the tensile strain is large and easily exceeds the maximum yield strength, resulting in the formation of cracks. On the other hand, some embodiments realized that, for AlGaN barriers with an Al composition over 0.40, 2-DEG mobility degrades due to lattice strain and interface roughness.

Therefore, some embodiments are directed towards increasing the carrier density in the 2 DEG channel without altering the concentration of Al in the barrier layer. In this regard, some embodiments are based on another realization that carrier density in the quantum well is directly proportional to the heterojunction area (i.e., the area of the barrier-channel interface). Based on experimentation, some example embodiments realized that instead of modifying the concentration of contents of the barrier, modification of the heterojunction area is a better choice for improving the carrier density in the 2 DEG channel formed at the barrier-channel interface.

Some example embodiments are based on another realization that the quantum well of the 2-DEG is confined under the barrier-channel interface of the HEMT and has a first extension between the source electrode and the drain electrode in one dimension and a second extension along the width of the gate electrode in another dimension. Some embodiments also realized that in order to increase the carrier density of the HEMT without modifying the contents of the layers of the HEMT, one approach may be to increase the area of the 2-DEG, which would amount to increasing one or both of the first extension and the second extension of the 2-DEG. However, increasing the first and/or second extension of the 2-DEG in a manner that leads to increase in the physical size of the HEMT and the wafer is undesired and disadvantageous for several reasons.

Accordingly, some example embodiments are directed towards alternate structures of the barrier-channel interface that increase the extension of the 2-DEG without increasing the overall size of the HEMT device. In this regard, modification to the shape or configuration of the barrier-channel interface is a better choice for improving the carrier density in the 2 DEG channel formed at the barrier-channel interface. A modified shape of the interface that offers a larger heterojunction area for a given chip area, results in increased carrier density and therefore lower sheet resistance. After continued experimentations and analysis of performances, some example embodiments realized that a corrugated shaped barrier-channel interface yields the highest carrier density in the quantum well (2 DEG) for a given chip area. Accordingly, it is an object of some example embodiments to provide a HEMT device with a corrugated shaped barrier-channel interface that yields an increment in the 2-DEG area. Accordingly, resulting from meticulous experimentations, some example embodiments utilize a fin shaped 2-DEG channel having a horizontal component perpendicular to the crystal plane (c-plane) and a vertical component parallel to a-plane.

Towards this end, at the barrier-channel interface, the channel layer may have a shape defined by a set of fins, and the barrier layer may have a shape defined by a series of wells. The set of fins of the channel layer is interdigitated with the series of wells of the barrier layer, thereby resulting in a corrugated shape of the barrier-channel interface. Accordingly, it is an object of some example embodiments to increase the second extension of the 2-DEG i.e., the width of the 2-DEG along the width of the gate electrode, without increasing the overall physical width of the transistor. The corrugated shaped barrier-channel interface yields a corrugated-shaped 2-DEG underneath the interface that has a series of first components along the c-axis and a series of second components that are perpendicular to the c-axis. The sum of lengths of the series of first components is equivalent to the width of the gate electrode, as is with the 2-DEG of a conventional HEMT. However, the sum of lengths of the series of second components provides additional length to the 2-DEG of the proposed transistor. As such, the 2-DEG of the proposed transistor has a total length that is longer in comparison to the 2-DEG of a conventional HEMT. Such a design yields a structure of the barrier-channel interface that increases the second extension of the 2-DEG in the transistor without increasing the overall size or area of the transistor. Some example embodiments achieve such a structure using a barrier layer formed with polar piezoelectric material having a lattice constant lower than a lattice constant of polar material forming the channel layer.

The barrier layer and the channel layer are grown along the c-axis along which spontaneous polarization is strong. However, there is usually negligible spontaneous polarization along the other direction that is perpendicular to the c-axis, and instead there is a piezoelectric effect in this direction that is perpendicular to the c-axis which yields the 2-DEG. By growing the barrier layer and the channel layer in a manner that yields a barrier-channel interface along the semi-polar plane, there is a formation of 2-DEG along two mutually perpendicular dimensions. That is, the 2-DEG in the proposed transistor has a component along the c-axis (due to the spontaneous polarization difference between the barrier and channel layers) as well as a component perpendicular to the c-axis (due to the piezoelectric effect between the barrier and channel layers). Towards this end, some example embodiments provide measures for forming the barrier-channel interface to have the corrugated shape. The channel layer may be etched in a direction along the semi-polar plane to form fins on the surface of the channel layer along the c-axis. The barrier layer may be grown on the etched channel layer and then etched in a direction along the semi-polar plane to form wells in the barrier layer such that wells of the barrier layer are interdigitated with fins of the channel layer. The etching of the fins and wells may be carried out with desired dimensions of the fins and wells in consideration. According to some embodiments, the 2-DEG in the proposed transistor is a series of fins defining a square-shaped pattern. The fin pitch of the 2-DEG is then equal to the distance between the rising ends of successive fins. Each fin of the 2-DEG has a height defined as the length of the rising end of the fin. As such, the proposed transistor provides an additional electron density that is directly proportional to the fin height of the fins of the 2-DEG and the piezoelectric difference between the materials of the barrier and the channel layers and inversely proportional to the fin pitch. Due to the fact that the proposed transistor provides an additional 2-DEG without increasing the gate width or the physical size of the transistor, the sheet resistance of the transistor is less than that of a conventional HEMT such as a planar HEMT.

Therefore, some example embodiments provide means for achieving a desired value of the sheet resistance of the transistor by choosing suitable materials for the barrier and channel layers and by growing them in such a manner that yields the barrier-channel interface to be along the semi-polar plane of the crystal in addition to being along the a-axis. The reduced sheet resistance in turn yields a very low contact resistance or on-resistance for the device, a very high on-current density, and a very low knee voltage for the device. These enhanced performance metrics are highly desirable in several applications such as power transistors and radiofrequency (RF) devices. Therefore, example embodiments provided herein yield an improved structure and design for the transistor.

In order to achieve the aforementioned objectives and improvements, some example embodiments provide a high electron mobility transistor having a corrugated shaped barrier-channel interface, devices utilizing such a high electron mobility transistor and methods of manufacturing such a high electron mobility transistor and devices based thereupon.

Some example embodiments provide a transistor comprising a plurality of electrodes forming a source, a gate, and a drain of the transistor and a layered semiconductor structure electrically connected to the plurality of electrodes. The layered semiconductor structure includes a channel layer having a shape formed by a series of fins and a barrier layer on the channel layer such that the barrier layer coats the fins of the channel layer to define a shape formed by a series of wells. The series of wells of the barrier layer are interdigitated with the series of fins of the channel layer. The barrier layer is formed with polar piezoelectric material having a first lattice constant and the channel layer is formed with polar material having a second lattice constant, where the second lattice constant is greater than the first lattice constant.

In yet some other embodiments a method of manufacturing a transistor is provided. The method comprises providing a substrate layer and a buffer layer on the substrate layer for the transistor. The method also comprises forming a channel layer with a polar material on the buffer layer and a barrier layer with a polar piezoelectric material on the channel layer such that the channel layer has a shape forming a series of fins and the barrier layer has a shape forming a series of wells interdigitated with the series of fins on the channel layer. The polar material of the channel layer has a lattice constant lower than the lattice constant of the polar piezoelectric material of the barrier layer. The method also comprises forming a source, a drain, and a gate electrode on the barrier layer.

According to some example embodiments, the method of manufacturing the transistor also comprises etching the channel layer in a direction along the semi-polar plane of the crystal. In some example embodiments, the method further comprises etching the barrier layer, grown on the etched channel layer, in a direction along the semi-polar plane of the crystal.

BRIEF DESCRIPTION OF THE DRAWINGS

The presently disclosed embodiments will be further explained with reference to the following drawings. The drawings shown are not necessarily to scale, with emphasis instead generally being placed upon illustrating the principles of the presently disclosed embodiments.

Figure 1A:
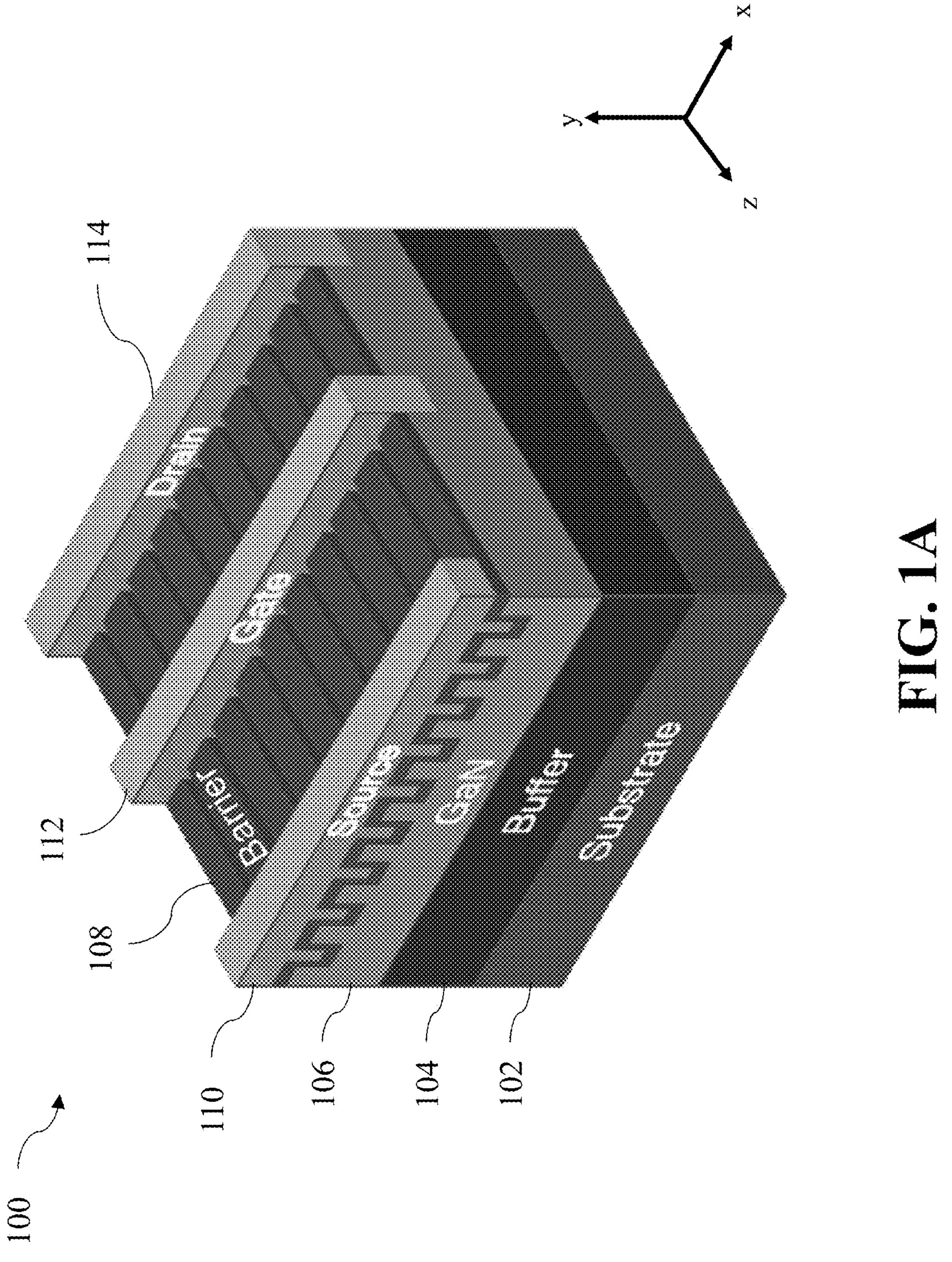
FIG. 1A illustrates a three-dimensional structure of a high electron mobility transistor (HEMT), according to some example embodiments.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like-reference numbers and designations in the various drawings may indicate like elements.

The semiconductor industry utilizes various methods and structures to form high electron mobility (HEM) semiconductor devices. For high power, high temperature, and/or high frequency applications, devices formed in wide bandgap semiconductor materials such as the Group III nitrides are often used. These materials, typically, have higher electric field breakdown strengths and higher electron saturation velocities. Hence some embodiments of such devices utilize layers of materials selected from group III or group V of the periodic table of elements. HEMT devices can operate at higher temperatures due to the wide bandgap of III-N materials used in HEMTs. Furthermore, HEMTs are highly suitable for high frequency operations. As such, HEMTs are a promising class of semiconductor devices that offer high power and high-frequency performance.

The AlGaN/GaN HEMT structure consists of several layers of materials grown on a substrate, typically a sapphire or silicon carbide wafer or a Coefficients of Thermal Expansion (CTE) matched-AlN material. The layers include a buffer layer, a GaN layer, an AlGaN layer, and a gate electrode. The buffer layer is used to reduce defects in the crystal structure of the substrate, which can degrade the performance of the device. The GaN layer provides the 2DEG channel, and the AlGaN layer is used to tune the properties of the channel. The gate electrode is used to control the flow of current through the channel. When a voltage is applied to the gate electrode, it creates an electric field that modulates the density of the 2DEG and the resistance of the channel. This allows the device to act as a switch or an amplifier, depending on the application.

One of the key advantages of AlGaN/GaN HEMTs is their high-power density. The 2DEG channel has a high electron mobility, which allows for efficient current flow at high voltages. This enables the device to handle high power levels while maintaining a low on-resistance. Additionally, the wide bandgap of the GaN material allows for high-temperature operation, which is important for many applications, including wireless communication systems and power electronics. Another advantage of AlGaN/GaN HEMTs is their high-frequency performance. The 2DEG channel has a low capacitance, which allows for fast switching speeds and high-frequency operation. This makes the device well-suited for use in radio frequency (RF) amplifiers and other high-frequency applications. Accordingly, AlGaN/GaN HEMTs have a wide range of potential applications. They are used in wireless communication systems, such as cellular base stations and satellite communication systems, due to their high power and high-frequency performance. They are also being used in power electronics applications, such as DC-DC converters and inverters, due to their high-power density and high-temperature operation. Additionally, AlGaN/GaN HEMTs have potential applications in sensing, imaging, and lighting. In conclusion, AlGaN/GaN High Electron Mobility Transistors are a promising class of semiconductor devices that offer high power and high-frequency performance. Their wide bandgap, high electron mobility, and low capacitance make them well-suited for a wide range of applications, including wireless communication systems and power electronics.

The comparatively high-power density with respect to conventional transistors in a HEMT stems from an underlying two-dimensional electron gas (2DEG) channel having a high electron mobility, which allows for efficient current flow at high voltages. This enables a HEMT to handle high power levels while maintaining a low on-resistance. Additionally, or alternatively, some specialized applications require the HEMT to have an on-resistance that is even lower than that of conventional HEMTs. Particularly, such applications desire higher current density for the HEMT but deny a considerable increase in the chip area of the resulting semiconductor device. Attempts to address this requirement have met with increased wafer size or limitations on other performance metrics for the transistor device. Some example embodiments provide a HEMT device configuration with an increased current density for a given chip area as compared to a planar HEMT configuration. The increased current density results from a low sheet resistance of the HEMT and thus for a given chip area, the proposed HEMT device architecture yields an on-resistance lower than that of conventional HEMTs. Such an architecture of the transistor allows for an increment in the heterojunction area leading to much higher carrier density in the device compared to a planar HEMT configuration.

Some embodiments are directed towards increasing the carrier density in the 2 DEG channel without altering the concentration of Al in the barrier layer. In this regard, some embodiments are based on another realization that carrier density in the quantum well is directly proportional to the heterojunction area (i.e., the area of the barrier-channel interface). Therefore, instead of modifying the concentration of contents of the barrier, some embodiments exploit the fact that modification of the shape or configuration of the barrier-channel interface is a better choice for improving the carrier density in the 2 DEG channel formed at the barrier-channel interface. In this regard, some embodiments provide a modified shape of the barrier-channel interface that offers a larger heterojunction area for a given chip area, resulting in increased carrier density and therefore lower sheet resistance.

Figure 1B:
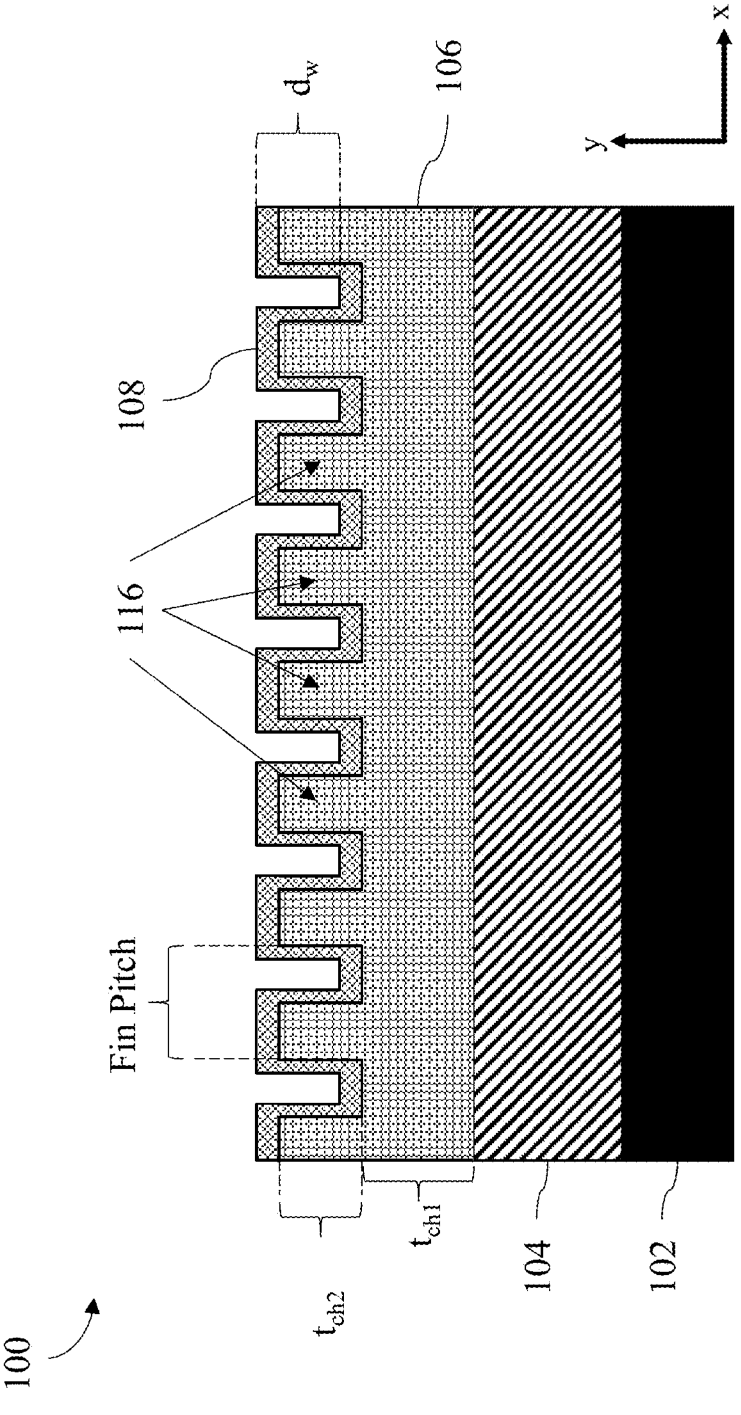
FIG. 1B illustrates a cross-sectional view of the HEMT of FIG. 1A, according to some example embodiments.
Figure 1B:
Figure 1C:
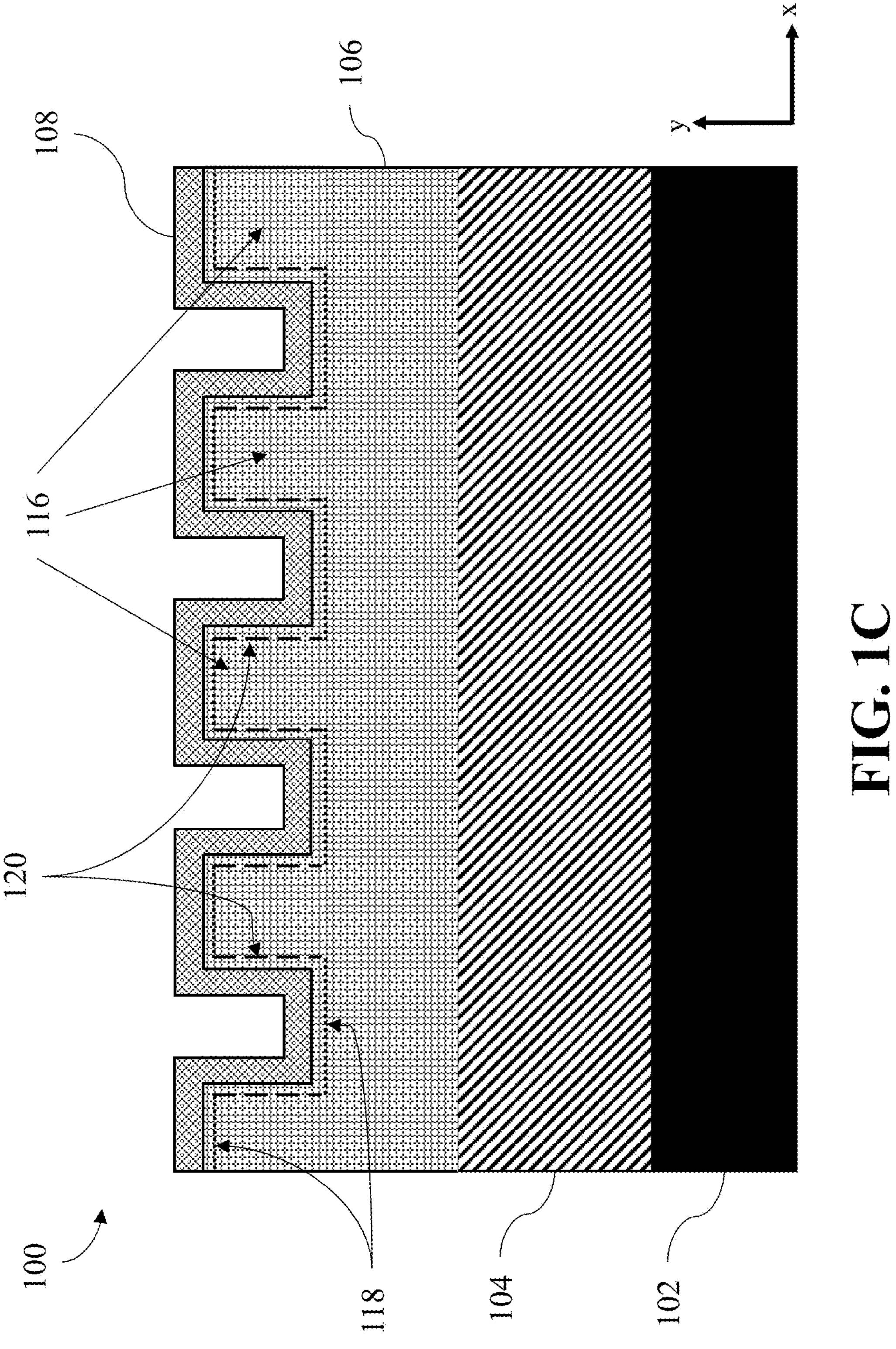
FIG. 1C illustrates another cross-sectional view of the HEMT of FIG. 1A showing 2-dimensional electron gas formed at the channel-barrier interface of the HEMT, according to some example embodiments.

FIG. 1A illustrates a three-dimensional structure of a high-electron mobility transistor (HEMT) 100, according to some example embodiments. The HEMT 100 has a structure spread across three orthogonal planes of a cartesian system such as one defined by x-axis, y-axis, and z-axis. For the sake of simplicity, the stacking of layers of the HEMT 100 may be considered to be along a vertical y-axis, and the span of each layer along a latitudinal and longitudinal plane may be considered to be along x and z axes. FIG. 1B illustrates a cross-sectional view of the HEMT 100 of FIG. 1A, according to some example embodiments. The cross section of the HEMT 100 corresponds to the view of the transistor 100 as seen in the xy plane. FIG. 1C illustrates another cross-sectional view of the HEMT 100 of FIG. 1A showing 2-dimensional electron gas formed at the channel-barrier interface of the HEMT, according to some example embodiments.

Referring to FIG. 1A, the HEMT 100 comprises a substrate layer 102 which may be, for example, a silicon carbide SiC substrate or a sapphire substrate. The substrate 102 may be a semi-insulating silicon carbide (SiC) substrate that may be, for example, the 4H polytype of silicon carbide. Other silicon carbide candidate polytypes may include the 3C, 6H, and 15R polytypes. The substrate may be a High Purity Semi-Insulating (HPSI) substrate. Although silicon carbide may be used as a substrate material, some example embodiments may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), Lanthanum aluminate ($LaAlO_3$, abbreviated as LAO), indium phosphide (InP), and the like. The substrate 102 may be a silicon carbide wafer, and the HEMT 100 may be formed, at least in part, via wafer-level processing, and the wafer may then be diced to provide a plurality of individual HEMTs 100. The substrate 102 may have a lower surface and an upper surface. In some embodiments, the substrate 102 may be a thinned substrate. In some embodiments, the thickness of the substrate 102 along the vertical y direction may be between 200 to 1120 nm.

The HEMT 100 also comprises a buffer layer 104 on the substrate 102. The buffer layer 104 may be grown to tackle the lattice mismatch between the wafer material and the III-N semiconductor. The buffer layer 104 may be formed by a deposition process, such as MOCVD, MBE, LPE, the like, or a combination thereof. According to some example embodiments, the buffer layer 104 includes one or a combination of C-doped GaN, and Fe-doped GaN material. In some embodiments, the thickness of the buffer layer 104 along the vertical y direction may be 2-4 μm.

As is shown in FIGS. 1A, 1B, and 1C, the HEMT 100 also comprises a channel layer 106 over the buffer layer 104. The channel layer 106 forms an interface with the buffer layer 104 at its lower surface while the upper or top surface of the channel layer 106 has a corrugated shape defined by fins 116 projecting in the vertical y-direction. That is, instead of a continuously straight or planar upper surface, the channel layer 106 has a square wave-shaped upper surface defined by a set of fins 116. According to some example embodiments, the set of fins 116 may be defined throughout a span of the channel layer 106 along the gate width. In some alternate embodiments, the set of fins 116 may be defined at select regions of the upper surface over a span of the channel layer 106 along the gate width to address specialized design and performance requirements for the HEMT 100.

The channel layer 106 may comprise a suitable III-N semiconductor material such as gallium nitride (GaN). The thickness of the channel layer may be defined along the vertical y direction. In some embodiments, the channel layer 106 may have a first thickness $t_{ch1}$ between the channel buffer interface and a base of the troughs of the fins 116, and a second thickness $t_{ch2}$ between the base of the troughs of the fins 116 and the channel-barrier interface along the vertical y-direction. Thus, the second thickness $t_{ch2}$ of the channel layer 106 may be the same as the height of the fins 116. According to some example embodiments, the first thickness of the channel layer 106 may be between 100 nm to 300 nm while the second thickness or the height of the fins 116 may be in the range of 10 nm to 200 nm. Referring to FIG. 1B, along the y-direction, the channel layer 106 may have its bottom surface in contact with the buffer layer 104 and its top surface is opposite to the bottom surface. The top surface of the channel layer 106 has a corrugated shape like a square wave owing to the set of fins 116. According to some example embodiments, the fin pitch of the series of fins may be between 10 nm to 1000 nm. Also, the ratio of height of a fin in the series of fins to a width of the fin in the series of fins may be between 3 to 10. However, it may be contemplated that any suitable value of the fin pitch and fin height may be chosen to meet a desired application as long as such a choice does not violate the operating principles of the transistor as known in the art. In some example embodiments, to meet the value of a desired sheet resistance, the fin height may be chosen in such a way that it increases the 2-DEG vertical charge required for the desired value of the sheet resistance.

The HEMT 100 also comprises a barrier layer 108 grown on the channel layer 106 in a manner such that the barrier layer 108 coats the fins 116 of the channel layer 106 to define a shape formed by a series of wells. Each well of the series of wells is formed between two consecutive fins of the set of fins 116. The series of wells of the barrier layer 108 interdigitate with the series of fins 116 of the channel layer 106. Each well of the series of wells has a depth $d_w$ as is shown in FIG. 1B. The barrier layer 108 may comprise a suitable material such as AlGaN. In some embodiments, the vertical thickness of the barrier layer 108 coating the fins 116 of the channel layer 106 along the vertical y-direction may be 20-50 nm, and a horizontal thickness of the coating of the barrier layer 108 along the horizontal x-direction may be 10-20 nm.

According to some example embodiments, the barrier layer 108 may be formed with a polar piezoelectric material and the channel layer 106 may be formed with a polar material. The lattice constant of the polar piezoelectric material of the barrier layer 108 may be lower than the lattice constant of the polar material forming the channel layer 106. According to some example embodiments, the polar piezoelectric material of the barrier layer 108 may include one or a combination of AlGaN, ScAlN, InAlN, AlN, InAlGaN. In some example embodiments, the polar material forming the channel layer 106 may include one or a combination of GaN and InGaN.

The barrier layer 108 and the channel layer 106 are grown along the c-axis of the crystal lattice along which spontaneous polarization is strong. However, there is usually negligible spontaneous polarization along the other direction that is perpendicular to the c-axis, and instead there is piezoelectric effect along this direction that is perpendicular to the c-axis which yields a 2-dimensional electron gas (2-DEG). By growing the barrier layer 108 and the channel layer 106 in a manner that yields a barrier-channel interface along the semi-polar plane, there is a formation of the 2-DEG along two mutually perpendicular dimensions. FIG. 1C illustrates a cross-sectional view of the HEMT 100 showing the 2-DEG formed at the channel-barrier interface. The 2-DEG is a combination of a series of two components.

Referring to FIG. 1C, the 2-DEG in the HEMT 100 has a series of vertical components 120 along the c-axis and parallel to a-plane and shown as thick dashed line (due to spontaneous polarization difference between the barrier and channel layers). The 2-DEG in the HEMT 100 also comprises a series of horizontal components 118 perpendicular to the c-axis shown as thin dashed line (due to the piezoelectric effect between the barrier and channel layers). Towards this end, some example embodiments provide measures for forming the barrier-channel interface to have the corrugated shaped. The channel layer 106 may be etched in a direction along the semi-polar plane to form fins 116 on the surface of the channel layer along the c-axis. The barrier layer 108 may be grown on the etched channel layer 106 and then etched in a direction along the semi-polar plane to form wells in the barrier layer 108 such that wells of the barrier layer 108 are interdigitated with fins 116 of the channel layer 106. The etching of the fins and wells may be carried out with desired dimensions of the fins and wells in consideration. According to some embodiments, the horizontal components 118 and the vertical components 120 of the 2-DEG in the HEMT provides a shape to the 2-DEG that is defined by a series of fins forming a square shaped pattern. Each fin of the 2-DEG is a combination of two successive vertical components 120 and a horizontal component 118 between those two successive vertical components 120. The fin pitch of the 2-DEG is then equal to the distance between the rising ends of successive fins of the 2-DEG which in some embodiments may be same as the fin pitch of the channel layer 106 shown in FIG. 1B. Each fin of the 2-DEG has a height defined as the length of the rising end of the fin. As such, the HEMT 100 provides an additional electron density that is directly proportional to the fin height of the fins of the 2-DEG and the piezoelectric difference between the materials of the barrier 108 and the channel 106 layers and inversely proportional to the fin pitch. Due to the fact that the HEMT provides an additional 2-DEG without increasing the gate width or the physical size of the transistor, the sheet resistance of the transistor is less than that of a conventional HEMT such as a planar HEMT.

Therefore, some example embodiments provide means for achieving a desired value of the sheet resistance of the transistor 100 by choosing suitable materials for the barrier 108 and channel 106 layers and by growing them in such a manner that yields the barrier-channel interface to be along the semi-polar plane of the crystal in addition to being along the a-axis. The reduced sheet resistance in turn yields a very low contact resistance or on-resistance for the device, a very high on-current density, and a very low knee voltage for the device. These enhanced performance metrics are highly desirable in several applications such as power transistors and radiofrequency (RF) devices. Therefore, example embodiments provided herein yield an improved structure and design for the HEMT 100.

A 2-DEG (two-dimensional electron gas) component can be formed at the barrier-channel heterojunction through a process known as polarization-induced doping. This phenomenon occurs due to the different spontaneous as well as piezoelectric polarization between the barrier and channel layers in the heterojunction. In FIG. 1C this component of the 2-DEG is referred to as horizontal component of the 2-DEG.

The set of fins 116 are formed along the a-plane so that it yields smooth interface. Since the sidewalls of the fins 116 are in non-polar direction, the spontaneous polarization charges are absent. However, 2-DEG is formed at the interface of barrier layer 108 and channel layer 106 because of piezoelectric charge difference between these two layers. Therefore, to enhance the 2-DEG concentration the barrier material needs to have very large piezoelectric co-efficient. A suitable choice of such barrier material may be ScAlN or AlN-both materials have strong piezoelectricity.

Figure 2:
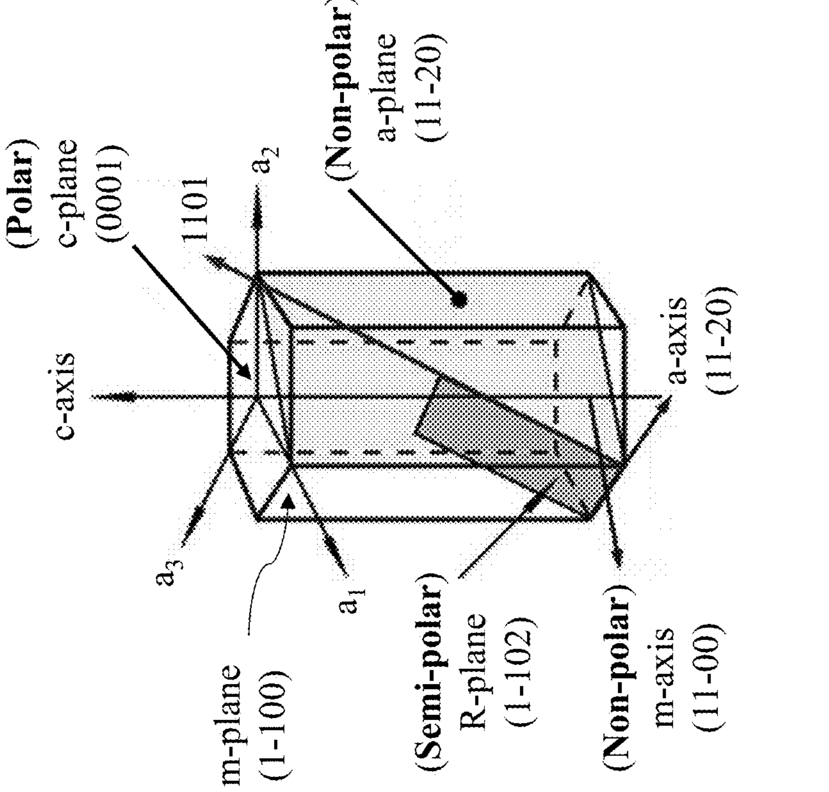
FIG. 2 illustrates a Group III-nitride (III-N) material crystal structure showing different polar, non-polar and semi-polar planes, according to some example embodiments.

FIG. 2 illustrates a Group III-nitride (III-N) material crystal structure showing different polar, non-polar and semi-polar planes in the III-N crystals, according to some example embodiments. The Group III-nitride (III-N) material may be GaN. Normally, the (0001) plane (c-plane) is most common in GaN growth, the planes perpendicular to the c-plane such as (1-100) (m-plane) and (11-20) (a-plane) planes, are nonpolar planes, as shown in FIG. 2. GaN grown on these planes would have no polarization field in the quantum well (QW). The growth of wide bandgap material over narrow bandgap material, results in a two-dimensional electron gas (2-DEG) at the heterointerface due to the conduction band discontinuity. Accumulation of the high density 2-DEG is due to the formation of a deep spike-shaped quantum well at the heterojunction, where there is a large conduction-band offset as well as a large discontinuity in the piezoelectric and spontaneous polarization. The growth of wide bandgap material over narrow band gap material creates a 2-DEG in the heterointerface, so that confinement of electrons in the quantum well is possible, which leads to higher mobility and resulting in a high-speed device. Also, the carrier density in the quantum well is directly proportional to the heterojunction area (i.e., the area of the barrier-channel interface). Therefore, in order to increase the carrier density in the quantum well, the area of the heterojunction should be increased. However, if the heterojunction area increases in a such a way that leads to increased chip area, it may render the HEMT 100 unsuitable for many applications. As such, without increasing chip area of the HEMT 100, some example embodiments modify a shape of the heterojunction so as to increase the heterojunction area. In this regard, owing to the structure described with reference to FIGS. 1A-1C, the HEMT 100 has a 2-DEG channel with a shape defined by a set of fins having horizontal components perpendicular to crystal plane (polar c-plane 0001) and vertical components parallel to non-polar a-plane (11-20).

The GaN channel layer is etched in a direction along the semi-polar R-plane (1-102) to form fins on the surface of the channel layer along the c-axis. The barrier layer may be grown on the etched channel layer and then etched in a direction along the semi-polar R-plane to form wells in the barrier layer such that wells of the barrier layer are interdigitated with fins of the GaN channel layer. As a result, the underlying 2-DEG formed at the barrier-GaN interface has a corrugated shape like a square wave. The electron density resulting from this configuration is directly proportional to the fin height of the fins of the 2-DEG and the piezoelectric difference between the materials of the barrier and the channel layers and inversely proportional to the fin pitch of the fins of the 2-DEG.

Since a conventional planar HEMT has 2-DEG only along a horizontal direction, the current density of such a planar GaN HEMT is given by $$\frac{I_{DS}}{W} = N_{horizontal-2DEG} \times \text{velocity of electron}$$

where IDS is the current flowing between drain and source of the HEMT, W is the width of the device, and $N_{horizontal-2DEG}$ is the number of charge carrier per unit area of the 2-DEG of the HEMT along the horizontal component of the 2-DEG.

However, since the HEMT 100 has 2-DEG along both horizontal and vertical directions, the contribution to current conduction is due to $N_{horizontal-2DEG}$ as well as $N_{vertical-2DEG}$ (number of charge carriers per unit area of the 2-DEG in the vertical component of the 2-DEG). Therefore, the current density of the HEMT 100 is given by:

$$\frac{I_{DS}}{W} = (N_{horizontal-2DEG} + N_{vertical-2DEG}) \times \text{velocity of electron}$$

As can be seen from the above equation, because of the $N_{vertical-2DEG}$ the current density of the HEMT 100 is higher than that of planar device. For a given chip area the HEMT 100 yields an on-resistance which is lower than that of a planar AlGaN GaN HEMT because the proposed HEMT has an additional electron density of $$2 \times \left(\frac{Fin\ \text{height}}{Fin\ \text{pitch}}\right) \times \left|\frac{\Delta P_{pz}}{q}\right|$$

where $\Delta P_{pz}$ is the difference between the piezoelectric polarization of the barrier layer and the channel layer; q is the electron charge in coulombs, and W is the total width of the HEMT device. Therefore, the HEMT device 100 reduces the sheet resistance by increasing the charge density for a given chip area. The HEMT device 100 may be used in audio amplifiers, power supplies, and other applications where high current and high input impedance and higher switching speed are desirable.

Referring to FIG. 1A, the HEMT 100 also comprises a plurality of electrodes such as one electrode each for a source 110, a gate 112, and a drain 114 of the HEMT 100. The metal contacts for these electrodes may be grown using any suitable process. In some example embodiments, the metal contacts may extend laterally in a plane of the top surface of the barrier layer 108. In some alternative embodiments, the metal contacts may extend vertically into the barrier layer 108 such that the metal contacts are orthogonal to the top surface of the barrier layer 108 as is shown in FIG. 1A. Other suitable configurations may also be possible within the scope of the disclosure.

The channel layer 106 and the barrier layer 108 may each be formed by epitaxial growth in some embodiments. The channel layer 106 may have a bandgap that is less than the bandgap of the barrier layer 108 and the channel layer 106 may also have a larger electron affinity than the barrier layer 108. The channel layer 106 and the barrier layer 108 may include Group III-nitride based materials.

In some embodiments, the barrier layer 108 may include AlN, ScAlN or combinations of layers thereof. The barrier layer 108 may comprise a single layer or may be a multilayer structure. In particular embodiments of the present invention, the barrier layer 108 may be thick enough and may have a high enough aluminum (Al) composition and doping to induce a significant carrier concentration at the interface between the channel layer 106 and the barrier layer 108 through polarization effects when the barrier layer 108 is buried under ohmic contact metal. The barrier layer 108 may, for example, be from about 1 nm to about 30 nm thick but is not so thick as to cause cracking or substantial defect formation therein. Barrier layer thicknesses in the range of 15-30 nm may be common. In certain embodiments, the barrier layer 108 may be undoped or doped with an n-type dopant to a concentration less than $10^{19}$ $cm^{-3}$. In some embodiments, the barrier layer 108 is $Al_xGa_{1-x}N$ where $0<x<1$. In particular embodiments, the aluminum concentration is about 25%. However, in other embodiments of the present invention, the barrier layer 108 comprises AlGaN with an aluminum concentration of between about 5% and less than about 100%. In specific embodiments of the present invention, the aluminum concentration is greater than about 10%. The channel layer 106 and/or the barrier layer 108 may be deposited, for example, by metal-organic chemical vapor deposition (MOCVD), molecular beam epitaxy (MBE), or hydride vapor phase epitaxy (HYPE).

The source contact 110, the gate contact 112 and the drain contact 114 are formed on an upper surface of the barrier layer 108 and are laterally spaced apart from each other. The electrode contacts 110-114 may form an ohmic contact to the barrier layer 108. According to some example embodiments, the source contact 110 may be coupled to a reference signal such as, for example, a ground voltage.

The electrode contacts 110-114 may include a metal that can form an ohmic contact to a gallium nitride-based semiconductor material. In this regard, suitable metals may include refractory metals, such as Ti, W, titanium tungsten (TiW), silicon (Si), titanium tungsten nitride (TiWN), tungsten silicide (WSi), rhenium (Re), Niobium (Nb), Ni, gold (Au), aluminum (Al), tantalum (Ta), molybdenum (Mo), NiSix, titanium silicide (TiSi), titanium nitride (TiN), WSiN, Pt and the like. Thus, the source contact 110 and the drain contact 114 may contain an ohmic contact portion in direct contact with the barrier layer 108. In some embodiments, the source contact 110 and/or the drain contact 114 may be formed of a plurality of layers to form an ohmic contact.

The gate contact 112 may be formed on the upper surface of the barrier layer 108 between the source contact 110 and the drain contact 114. The material of the gate contact 112 may be chosen based on the composition of the barrier layer 108, and may, in some embodiments, be a Schottky contact. In this regard, materials capable of making a Schottky contact to a gallium nitride-based semiconductor material may be used, such as, for example, nickel (Ni), platinum (Pt), nickel silicide (NiSix), copper (Cu), palladium (Pd), chromium (Cr), tungsten (W) and/or tungsten silicon nitride (WSIN).

A two-dimensional electron gas (2DEG) layer is formed at a junction between the channel layer 106 and the barrier layer 108 when the HEMT device 100 is biased to be in its conducting or "on" state. The 2DEG layer acts as a highly conductive layer that allows current to flow between the source and drain regions of the device that are beneath the source contact 110 and the drain contact 114, respectively.

Figure 3B:
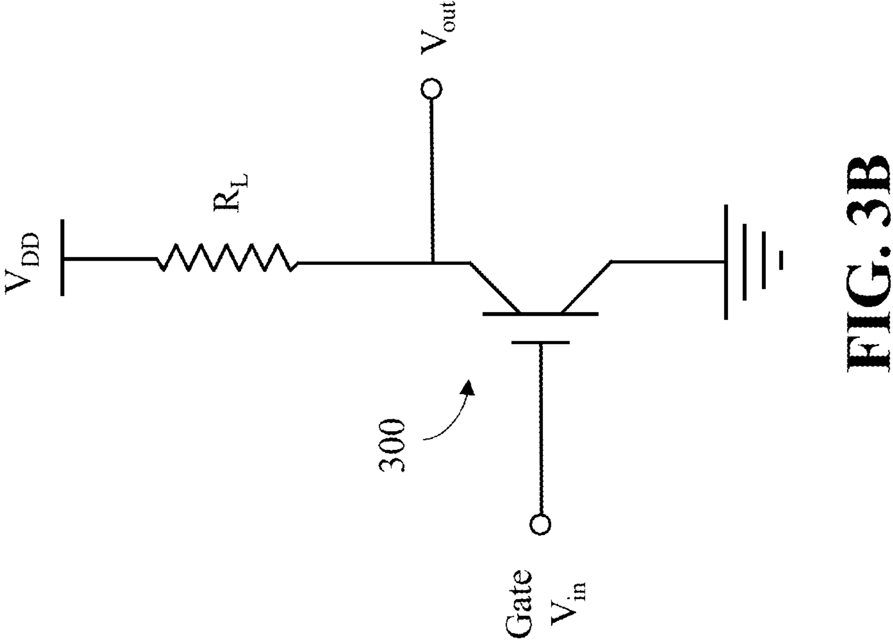
FIG. 3B illustrates a circuit diagram of an inverter realized using the HEMT of FIG. 1A, according to some example embodiments.
Figure 3A:
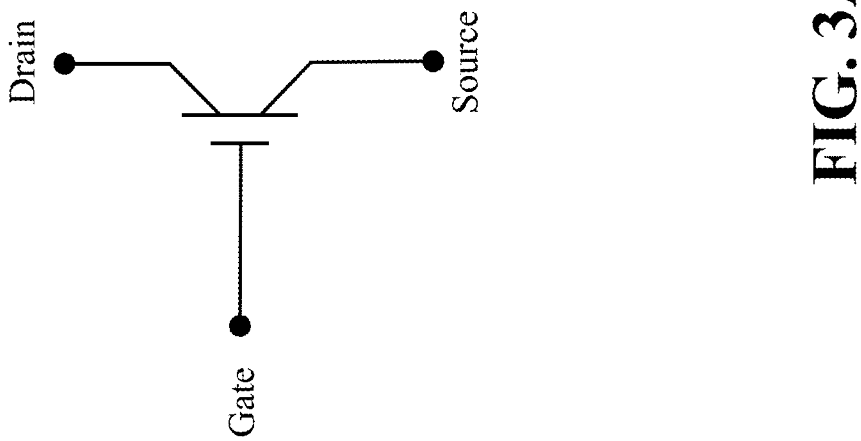
FIG. 3A illustrates an equivalent circuit symbol of the HEMT of FIG. 1A, according to some example embodiments.

The equivalent circuit representation of the HEMT device 100 is illustrated in FIG. 3A. The HEMT device 100 has a gate terminal, a source terminal, and a drain terminal.

FIG. 3B illustrates circuit diagram of an inverter realized using the HEMT of FIG. 3A, according to some example embodiments. Inverters are used in sorts of electronic circuits. It is the fundamental building block of a digital circuit. Apart from digital circuits, it is also used in various power electronic circuits as well. An input voltage $V_{in}$ is provided at the gate of the HEMT 300. The source of the HEMT device 300 is grounded while the drain is connected to drain voltage $V_{DD}$ through a resistor $R_L$. The inverted output $V_{out}$ is taken from the drain of the device 300.

Figure 4:
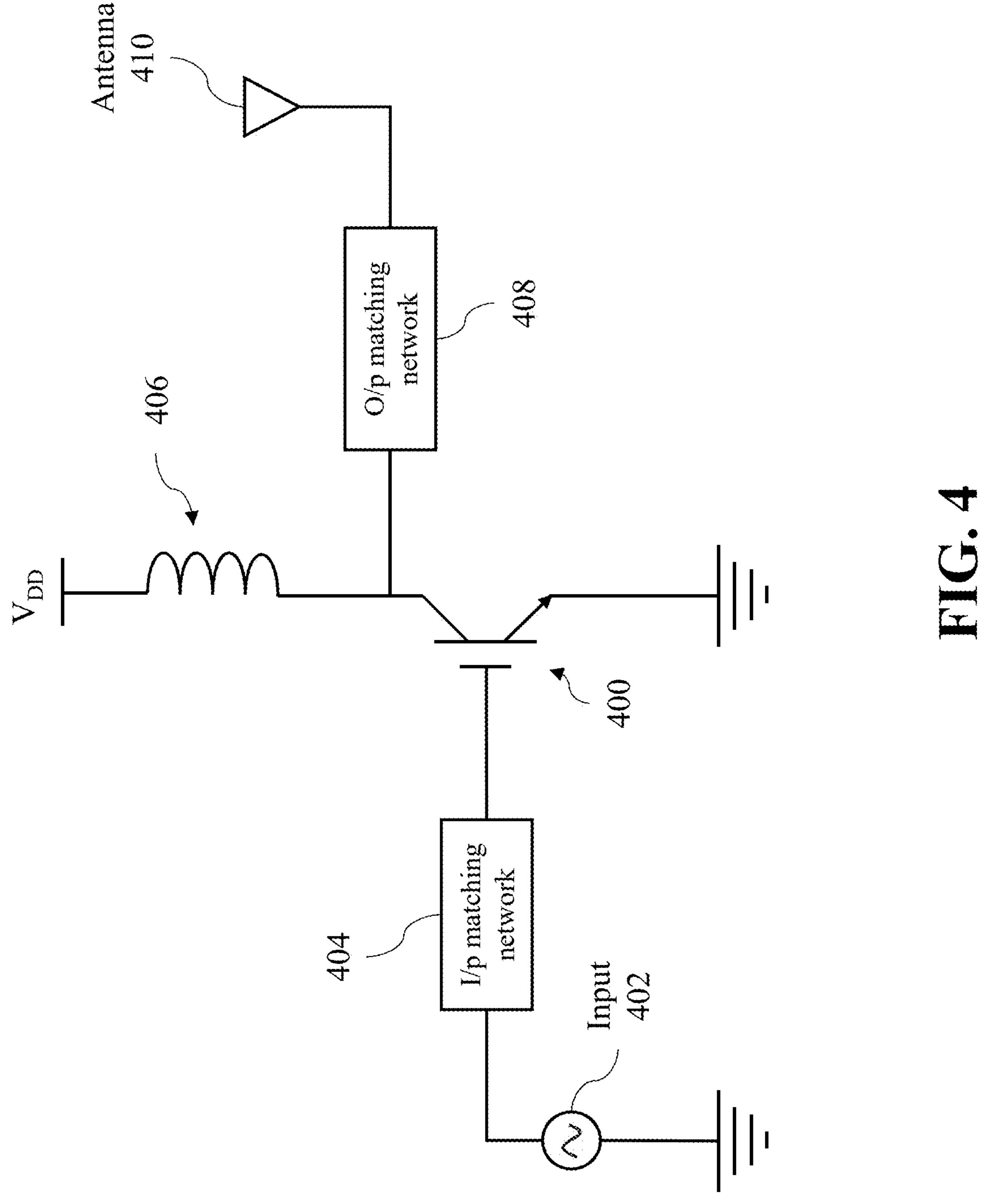
FIG. 4 illustrates circuit diagram of a power amplifier realized using the HEMT of FIG. 1A, according to some example embodiments.

FIG. 4 illustrates circuit diagram of a power amplifier realized using a semiconductor device 400 such as the HEMT of FIG. 3A, according to some example embodiments. Power amplifiers are used in all wireless communication circuits. It is an integral part of RF front-end module of any cell phone as well as based stations. An input signal 402 is supplied to an input matching network 404 which is connected to the gate of the semiconductor device 400. The source terminal of the semiconductor device 400 is connected to the ground while the drain of the compound semiconductor device 400 is connected to the voltage $V_{DD}$ through an inductor 406. The drain is also connected to an output-matching network 408 through which a radio frequency signal is transmitted via an antenna 410. In such a configuration as illustrated in FIG. 4, the semiconductor device 400 amplifies the input signal 402 for transmission via the antenna 410 after it has been matched by the output matching network 408.

Figure 5:
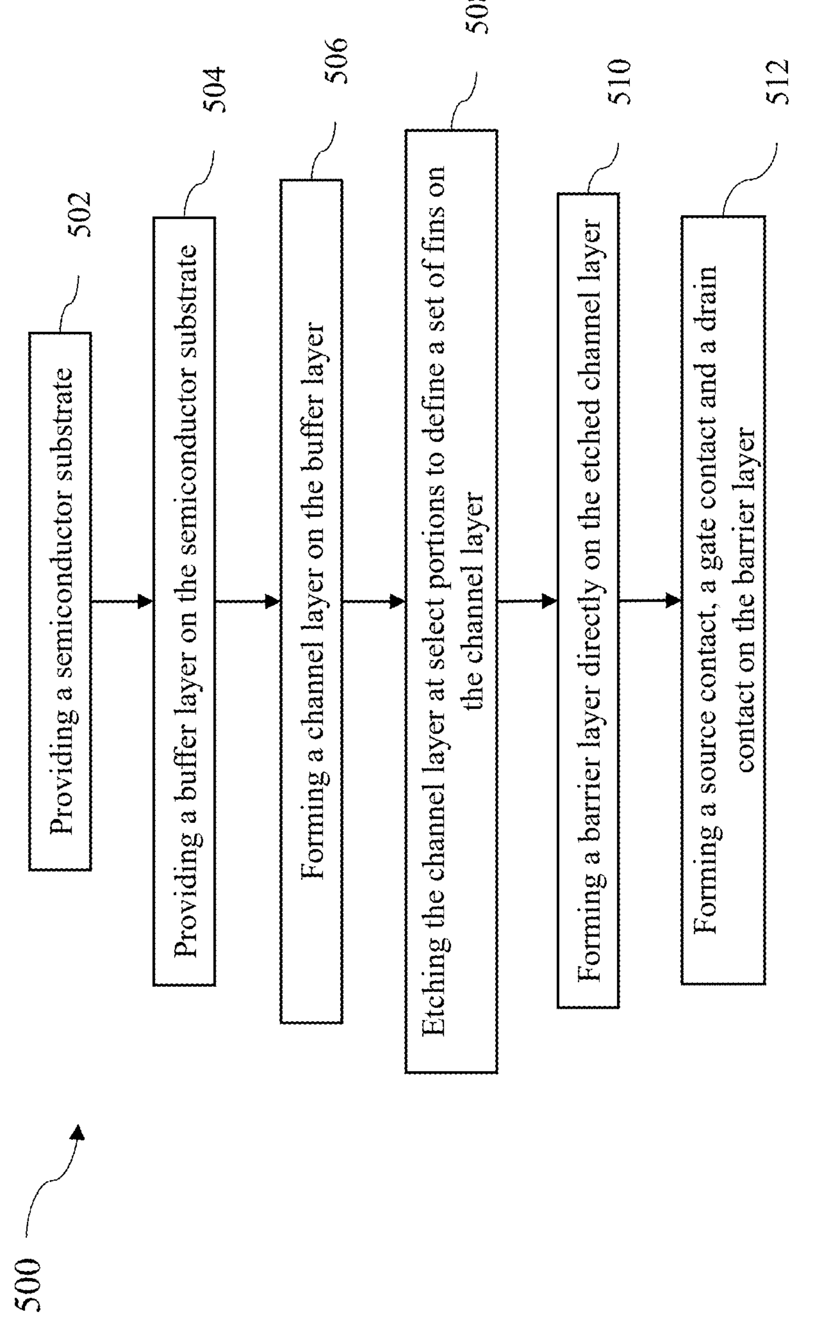
FIG. 5 illustrates a flowchart of a method of manufacturing the HEMT of FIG. 1A, according to some example embodiments.

FIG. 5 illustrates a flowchart of a method of manufacturing the HEMT 100 of FIG. 1A, according to some example embodiments. The steps of the method 500 as described in FIG. 5 may be executed in any order and/or one or more steps may be executed in combination. Referring to FIG. 5, the method 500 comprises providing 502 a semiconductor substrate such as the substrate 102 of FIG. 1A. In some example embodiments, the semiconductor substrate may be a semi-insulating silicon carbide (SiC) substrate that may be, for example, the 4H polytype of silicon carbide. The method also comprises providing 504 a buffer layer such as the layer 104 on the semiconductor substrate. The buffer layer may be grown to tackle the lattice mismatch between the wafer material and the III-N semiconductor.

A channel layer, such as the layer 106 of FIG. 1A which is made up of a suitable III-N semiconductor material such as gallium nitride (GaN), is formed 506 on the buffer layer. The channel layer may have a bottom surface, in contact with the buffer layer, and a top surface that is opposite to the bottom surface.

The method further comprises etching 508 the channel layer at select portions to define a set of fins on the channel layer as is shown in FIGS. 1B and 1C. In this regard, chlorine-based etching or mesa etching may be utilized. The method further comprises forming 510 a barrier layer such as the barrier layer 108 of FIG. 1A on the etched channel layer. Formation of the barrier layer in between the fins causes the resultant barrier layer to coat the fins of the channel layer. The method 500A proceeds to forming 512 the metal contacts for the source, drain, and gate electrodes on the barrier layer which gives the HEMT structure shown in FIG. 1A.

Some example processes and sub-processes deployed for the formation of the compound semiconductor device of FIG. 1A are described next. The semiconductor substrate is formed. According to some example embodiments, the substrate may include silicon, aluminum oxide ($Al_2O_3$), silicon carbide (SiC) or even GaN. The method 500 further comprises providing 504 a buffer layer on the semiconductor substrate and forming/growing 506 a channel layer on the buffer layer. The buffer layer may be formed by heavily carbon doped AlGaN layers with high Al concentration. For example, the Al concentration in the buffer layer may be between 50% to 80%. According to some example embodiments, the channel layer may be an unintentionally doped GaN layer. According to some example embodiments, the steps 502-506 may be performed using MOCVD (metal organic chemical vapor deposition) or MBE (Molecular Beam Epitaxy) process.

At 508, the method 500 comprises etching the channel layer at select portions to define a set of protruding fins on the channel layer. In this regard, a hard mask layer is formed on top of the channel layer. The hard mask layer has a high etch selectivity with respect to the material (e.g., GaN) of the channel layer and may be formed by lithography. In this regard, for a GaN channel layer, a suitable choice for the hard mask layer may be silicon-dioxide ($SiO_2$). After masking, the GaN channel layer may be etched using the chlorine and $BCl_3$ plasma. The chlorine-based plasma etches the GaN layer but not the $SiO_2$ hard mask, thereby leaving protruding fins on the top surface of the channel layer with a depression between two consecutive fins. After formation of the fins on the channel layer, the $SiO_2$ hard mask layer is etched away, and the wafer is cleaned using the industry standard RCA cleaning process.

At 510, a barrier layer is formed directly on the etched channel layer. In this regard, any suitable regrowth technique in an MOCVD or MBE chamber may be utilized. Since the barrier layer is formed on the etched channel layer, the structure of the barrier layer so formed is similar to that of a square wave pattern such that the barrier layer coats the etched channel layer, and the barrier layer structure defines a series of wells interdigitated with the fins of the channel layer.

At 512, source and drain contacts are formed using deposition lithography and etch process. The ohmic metals/metal compounds used for this purpose may include Ti/Al/Ti/TiN. The source and drain contacts are ohmic. The gate metal is formed using a similar process. However, the gate metal contact is a Schottky contact, and Ni TiN metal may be used for the gate metal. According to some example embodiments, after formation of the metal contacts, the transistor may be passivated with silicon nitride layer.

It may be noted that since the lateral extension of the 2-DEG channel is usually fixed as per the gate width of the transistor, the total length (and hence area) of the 2-DEG channel formed at the barrier-channel interface is dependent on the vertical extension of the fins of the channel layer. Therefore, to achieve a desired value of the sheet resistance of the transistor, the etching process at step 508 of the method 500 provides an opportunity to control the vertical extension or height of the fins by controlling the extent of the etching of the channel layer. It may be contemplated that the thickness of the unetched channel layer also plays a crucial role in this regard and hence should be chosen accordingly.

The method 500 thus yields a novel transistor having a reduced sheet resistance which in turn yields a very low contact resistance or on-resistance for the device, a very high on-current density, and a very low knee voltage for the device. These enhanced performance metrics are highly desirable in several applications such as power transistors and radiofrequency (RF) devices.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current-carrying electrode means an element of a device that carries current through the device such as a source or a drain of an MOS transistor or an emitter or a collector of a bipolar transistor or a cathode or anode of a diode, and a control element or control electrode means an element of the device that controls the current through the device such as a gate of a MOS transistor or a base of a bipolar transistor. Additionally, one current carrying element may carry current in one direction through a device, such as carry current entering the device, and a second current carrying element may carry current in an opposite direction through the device, such as carry current leaving the device.

Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through the conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of the duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted" means an active state of the signal, and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used.

The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures, or characteristics may be combined in any suitable manner, as would be apparent to one of ordinary skill in the art, in one or more embodiments. For clarity of the drawings, doped regions of device structures are illustrated as having generally straight-line edges and precise angular corners. However, those skilled in the art understand that due to the diffusion and activation of dopants the edges of doped regions generally may not be straight lines and the corners may not be precise angles.

In addition, the description of one or more embodiments may illustrate a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

The embodiments illustrated and described hereinafter suitably may have embodiments and/or may be practiced in the absence of any element which is not specifically disclosed herein. The foregoing description provides exemplary embodiments only, and is not intended to limit the scope, applicability, or configuration of the disclosure. Rather, the description of the exemplary embodiments will provide those skilled in the art with an enabling description for implementing one or more exemplary embodiments.

Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicate like elements.

Also, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be rearranged. A process may be terminated when its operations are completed but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

What is claimed is:

1. A transistor, comprising:

a plurality of electrodes forming a source, a gate, and a drain of the transistor; and a layered semiconductor structure electrically connected to the plurality of electrodes, the layered semiconductor structure comprising:

a channel layer having a shape formed by a series of fins; and a barrier layer on the channel layer such that the barrier layer coats the fins of the channel layer to define a shape formed by a series of wells, wherein the series of wells of the barrier layer are interdigitated with the series of fins of the channel layer, wherein the barrier layer comprises a polar piezoelectric material having a first lattice constant, wherein the channel layer comprises a polar material having a second lattice constant, and wherein the second lattice constant is greater than the first lattice constant;

wherein a shape of each of the source and the drain has a set of electrode fins on a side that forms electrical contact with the barrier layer, and wherein the set of electrode fins of the source and the drain are coupled with the series of wells of the barrier layer and interdigitated with the series of fins of the channel layer.

2. The transistor of claim 1, wherein the layered semiconductor structure further comprises:

a buffer layer adjacent to the channel layer, wherein the buffer layer includes one or a combination of gallium nitride (GaN), aluminum gallium nitride (AlGaN), carbon-doped GaN (C—GaN), and iron doped GaN (Fe-doped GaN); and a substrate layer adjacent to the buffer layer, wherein the substrate layer includes one or a combination of silicon (Si), silicon carbide (SiC), GaN, sapphire, and coefficient of linear thermal expansion (CTE) matched-aluminum nitride material.

3. The transistor of claim 1, wherein the barrier layer includes one or a combination of aluminum nitride (AlN), aluminum gallium nitride (AlGaN), and scandium doped aluminum nitride (ScAlN) with a hexagonal crystal structure.

4. The transistor of claim 1, wherein the barrier layer is thinner than the channel layer.

5. The transistor of claim 1, wherein shape of the gate has a set of electrode fins on a side that forms electrical contact with the barrier layer.

6. The transistor of claim 5, wherein a cross-section of the barrier layer has a square wave shape with constant pitch.

7. The transistor of claim 1, wherein the polar material of the channel layer includes III-N crystals, and wherein the series of fins of the channel layer are formed along a crystal axis of the III-N crystals.

8. The transistor of claim 1, wherein a height of a fin in the series of fins is between 10 nm to 200 nm, wherein a pitch of a fin in the series of fins is between 10 nm to 1000 nm.

9. The transistor of claim 8, wherein a ratio of height of a fin in the series of fins to a width of the fin in the series of fins is between 3 to 10.

10. The transistor of claim 1, wherein a 2-dimensional electron density (DEG) is formed at the interface of the barrier layer and channel layer, and wherein a shape of the 2-DEG is corrugated.

11. The transistor of claim 10, wherein the 2-DEG has a vertical portion and a horizontal portion, and wherein density of charge in the horizontal portion is greater than that of the vertical portion.

12. The transistor of claim 11, wherein the vertical portion of the 2-DEG is formed due to piezoelectric nature of the barrier layer and a sidewall of each fin of the series of fins is aligned with a non-polar direction.

13. The transistor of claim 11, wherein the horizontal portion of the 2-DEG is formed due to spontaneous and piezoelectric polarization and a top surface of each fin of the series of fins is in a polar directioned c-axis.

14. The transistor of claim 1, wherein sidewalls of the series of fins are along a non-polar a-axis.

15. A method of manufacturing a semiconductor device, comprising:

providing a substrate layer of the semiconductor device, and a buffer layer on the substrate layer of the semiconductor device;

forming, a channel layer with a polar material on the buffer layer, and a barrier layer with a polar piezoelectric material on the channel layer such that the channel layer has a shape forming a series of fins and the barrier layer has a shape forming a series of wells interdigitated with the series of fins on the channel layer; and forming a source electrode and a drain electrode on the barrier layer, wherein the polar material of the channel layer has a lattice constant lower than the lattice constant of the polar piezoelectric material of the barrier layer wherein a shape of each of the source electrode and the drain electrode has a set of electrode fins on a side that forms electrical contact with the barrier layer, and wherein the set of electrode fins of the source electrode and the drain electrode are coupled with the series of wells of the barrier layer and interdigitated with the series of fins of the channel layer.

16. The method of claim 15, further comprising forming a gate electrode on the barrier layer.

17. The method of claim 15, wherein forming the channel layer and the barrier layer further comprises:

etching the channel layer in a direction along a semi-polar plane of substrate crystal;

growing the barrier layer on the etched channel layer; and etching the grown barrier layer in a direction along a semi-polar plane of the substrate crystal.

* * * * *